(12) United States Patent
Kiwitt et al.

(10) Patent No.: US 10,049,812 B2
(45) Date of Patent: Aug. 14, 2018

(54) CIRCUIT ARRANGEMENT

(71) Applicant: Snaptrack Inc., San Diego, CA (US)

(72) Inventors: Jürgen Kiwitt, München (DE); Robert Koch, München (DE); Maximilian Pitschi, Rottach-Egern (DE)

(73) Assignee: SnapTrack, Inc., San Diego, CA (US)

( * ) Notice: Subject to any disclaimer, the term of this patent is extended or adjusted under 35 U.S.C. 154(b) by 230 days.

(21) Appl. No.: 14/650,300

(22) PCT Filed: Nov. 27, 2013

(86) PCT No.: PCT/EP2013/074890
§ 371 (c)(1),
(2) Date: Jun. 6, 2015

(87) PCT Pub. No.: WO2014/095281
PCT Pub. Date: Jun. 26, 2014

(65) Prior Publication Data
US 2015/0310987 A1  Oct. 29, 2015

(30) Foreign Application Priority Data
Dec. 18, 2012 (DE) .................. 10 2012 112 571

(51) Int. Cl.
*H01F 38/14* (2006.01)
*H01F 27/28* (2006.01)
(Continued)

(52) U.S. Cl.
CPC ......... *H01F 38/14* (2013.01); *H01F 27/2804* (2013.01); *H03H 9/706* (2013.01); *H03H 9/725* (2013.01); *H01F 2038/143* (2013.01)

(58) Field of Classification Search
CPC ..................................................... H01F 38/14
See application file for complete search history.

(56) References Cited

U.S. PATENT DOCUMENTS 7,151,430 B2  12/2006  Mattsson
8,276,259 B1 * 10/2012  Findley ............... H01F 17/0006
29/603.25

(Continued)

FOREIGN PATENT DOCUMENTS

DE   102010008774 A1   8/2011
EP       2530837 A1  12/2012
(Continued)

OTHER PUBLICATIONS

International Search Report and Written Opinion—PCT/EP2013/074890—ISA/EPO—dated Mar. 6, 2014.

*Primary Examiner* — Jared Fureman
*Assistant Examiner* — James Evans
(74) *Attorney, Agent, or Firm* — Patterson & Sheridan, L.L.P.

(57) ABSTRACT

A circuit arrangement can be used for adapting the electroacoustic properties of an electroacoustic component. The circuit arrangement includes a first conductor loop and a further element. The first conductor loop includes a main loop and a negative feedback loop. The negative feedback loop has a sense of curvature that is opposite to a sense of curvature of the main loop. The negative feedback loop compensates for a coupling between the main loop and the further element.

11 Claims, 5 Drawing Sheets

(51) Int. Cl.
  *H03H 9/70*  (2006.01)
  *H03H 9/72*  (2006.01)

(56) References Cited

U.S. PATENT DOCUMENTS

| | | | |
|---|---|---|---|
| 8,436,697 B2 | 5/2013 | Takamine | |
| 2006/0226943 A1 | 10/2006 | Marques | |
| 2011/0037535 A1* | 2/2011 | Kitamura | H03H 9/0566 333/134 |
| 2011/0254639 A1 | 10/2011 | Tsutsumi et al. | |
| 2012/0081192 A1* | 4/2012 | Hanaoka | H04B 1/0057 333/132 |
| 2012/0286896 A1* | 11/2012 | Takamine | H03H 9/6483 333/133 |
| 2012/0326808 A1 | 12/2012 | Moreno Granado et al. | |
| 2013/0043961 A1* | 2/2013 | Gebauer | H03H 9/0566 333/133 |
| 2014/0152398 A1* | 6/2014 | Kayahara | H01F 19/04 333/131 |
| 2015/0222246 A1* | 8/2015 | Nosaka | H03H 9/6483 333/187 |

FOREIGN PATENT DOCUMENTS

| | | | |
|---|---|---|---|
| JP | 2008118192 A | 5/2008 | |
| JP | 2009135815 A | 6/2009 | |
| JP | 2012080246 A | 4/2012 | |
| WO | 2004012213 A1 | 2/2004 | |
| WO | 2005117255 A1 | 12/2005 | |
| WO | 2011092879 A1 | 8/2011 | |
| WO | WO 2012081307 A1 * | 6/2012 | H01F 19/04 |

* cited by examiner

CIRCUIT ARRANGEMENT

This patent application is a national phase filing under section 371 of PCT/EP2013/074890, filed Nov. 27, 2013, which claims the priority of German patent application 10 2012 112 571.6, filed Dec. 18, 2012, each of which is incorporated herein by reference in its entirety.

TECHNICAL FIELD

The present invention relates to a circuit arrangement for adapting the electroacoustic properties of an electroacoustic component.

BACKGROUND

In circuit arrangements comprising electroacoustic components, the use of integrated coils is often necessary in order to achieve the requirements made with regard to adaptation, bandwidth, selection and isolation. In this case, inductive couplings arise between the coils and between coils and conductors on a chip, which influence the selection and isolation in other signal paths or frequency ranges.

Various possibilities for reducing these inductive couplings or influencing them in a desired manner are known from U.S. Patent Application Publication No. 2011/0254639 A1, WO Publication No. 2011/092879 A1 and U.S. Pat. No. 7,151,430 B2.

SUMMARY

Embodiments of the present invention specify a simple possibility for setting the inductive coupling.

A circuit arrangement for adapting the electroacoustic properties of an electroacoustic component is proposed, which circuit arrangement comprises a first conductor loop and a further element. The first conductor loop comprises a main loop and a negative feedback loop, wherein the negative feedback loop has a sense of curvature which is opposite to a sense of curvature of the main loop. The negative feedback loop compensates for a coupling between the main loop and the further element.

The further element can be an arbitrary element of the circuit arrangement. By way of example, the further element can be a further conductor loop. The further element can also be an output conductor loop formed by a connection configured in a balanced fashion. The further element can also be a current path of the circuit arrangement which forms an inductance.

The first conductor loop and the further element can be arranged at an arbitrary distance from one another in the topology of the equivalent circuit diagram. In this case, the coupling between the first conductor loop and the further element has a particularly strong influence on the characteristic of the circuit arrangement if a large part of the topology of the equivalent circuit diagram of the circuit arrangement is bridged by the coupling.

The circuit arrangement can be, for example, a circuit arrangement comprising electroacoustic components. Electroacoustic components are, for example, components which operate with surface acoustic waves (SAW) or components which operate with bulk acoustic waves (BAW). The circuit arrangement can, for example, connect an antenna connection to a transmission connection and to a reception connection.

Furthermore, the first conductor loop and/or the further element can be in each case an adapting coil which is interconnected in the circuit arrangement for adapting the acoustic properties. The first conductor loop and/or the further element can be arranged in each case between antenna connection and reception connection or between antenna connection and transmission connection.

If the coupling between the main loop and the further element is compensated for by the negative feedback loop, then this constitutes a space-saving possibility since the negative feedback loop has a significantly smaller space requirement in comparison with a shielding of the coupling, for instance by ground areas or "via fences". Accordingly, a coupling between the first conductor loop and the further element can be compensated for even in the case of a high degree of miniaturization of the circuit arrangement.

Compensation of the coupling by the negative feedback loop is furthermore also possible in the case of operation unbalanced to ground. The coupling is compensated for with a broadband effect. Restrictions of a filter topology are not necessary. Furthermore, this possibility of compensation of coupling can be used independently of the housing technology used.

The coupling between two loops is an inductive coupling. The coupling which is compensated for by the negative feedback loop can be a parasitic coupling which alters the electroacoustic properties of the circuit arrangement in an undesirable manner.

A connecting line between a geometrical centroid of the negative feedback loop and a geometrical centroid of the main loop can define an effective direction of the negative feedback loop. In one exemplary embodiment, the effective direction of the negative feedback loop deviates by a maximum of 50° from a direction of the coupling between the main loop and the further element, wherein the direction of the coupling is defined by the connecting line of the geometrical centroids of the main loop and of the further element.

If the first conductor loop is configured in accordance with this design specification, then a coupling between the main loop and the further element can be compensated for effectively. In this case, the coupling between the further element and the negative feedback loop can counteract the coupling between the further element and the main loop. The effects of the two couplings can substantially cancel one another out. A parasitic, undesirable coupling can be virtually compensated for in this way.

The negative feedback loop can have a length which corresponds to at least 70% of a turn of the main loop. The negative feedback loop can have a single turn. The turn of the negative feedback loop can be wound around the turns of the main loop with a sense of curvature which is opposite to that of the main loop, such that the space requirement of the first conductor loop is increased only very slightly by the negative feedback loop. Accordingly, a space-saving circuit arrangement can be designed overall.

The negative feedback loop can have an ellipse-segment-shaped turn, wherein the end points of the ellipse segment form an angle of at least 90° with the midpoint of the associated ellipse. Preferably, the end points of the ellipse segment form an angle of at least 160° with the midpoint of the associated ellipse. In particular, the ellipse-segment-shaped turn can be a circle-segment-shaped turn, wherein the end points of the circle segment form an angle of at least 90° with the midpoint of the associated circle, wherein the angle is preferably at least 160°.

The negative feedback loop can have a lower inductance than the main loop.

The circuit arrangement can comprise a chip arranged on a substrate, wherein the first conductor loop is arranged on that side of the substrate which faces the chip. The chip can furthermore comprise component structures. The component structures can be electroacoustic components, for example. Accordingly, the first conductor loop can be arranged directly opposite an electroacoustic component. The first conductor loop and the electroacoustic components can be arranged in a cavity formed between the chip and the substrate.

Alternatively, the first conductor loop can be arranged in the substrate. The substrate can be in the form of a monolayer or can be multilayered. In the case of a multilayered substrate, the first conductor loop can either be arranged in a single layer of the substrate or extend over a plurality of layers of the substrate. By way of example, the main loop could be arranged in a first layer of the substrate, and the negative feedback loop in a second layer of the substrate.

The circuit arrangement can furthermore comprise an electroacoustic component, wherein the first conductor loop adapts the acoustic properties of the circuit arrangement. The electroacoustic properties which are adapted by the first conductor loop can be, for example, the pass characteristic of the circuit arrangement. The electroacoustic component can involve MEMS components.

The further element can be a further conductor loop. The further element can be arranged at an arbitrary location in the equivalent circuit diagram of the circuit arrangement, wherein the coupling between the first conductor loop and the further element is relevant to the characteristic of the circuit arrangement particularly if the coupling bridges a large part of the topology of the circuit arrangement. Furthermore, couplings having a high coupling strength are also always relevant.

The circuit arrangement can furthermore comprise a plurality of further elements which in each case couple to the main loop of the first conductor loop, wherein the couplings are superposed to form a total coupling, and wherein the negative feedback loop compensates for the total coupling. The first conductor loop is accordingly not just configured to compensate for couplings to a single further element, but rather can also simultaneously compensate for couplings to a plurality of further elements.

The direction of the negative feedback loop can deviate by a maximum of 50° from each of the directions of the couplings between the main loop and the further elements.

In accordance with a further aspect, an arrangement is proposed which comprises a circuit arrangement for adapting the electroacoustic properties of an electroacoustic component and an electroacoustic component. The circuit arrangement can be the circuit arrangement described above. Accordingly, the structural and functional features of the circuit arrangement described above can also be present in the arrangement.

The electroacoustic component can be an MEMS component.

BRIEF DESCRIPTION OF THE DRAWINGS

The invention is explained in greater detail below on the basis of exemplary embodiments and the associated figures.

In the figures.

DETAILED DESCRIPTION OF ILLUSTRATIVE EMBODIMENTS

Figure 1:
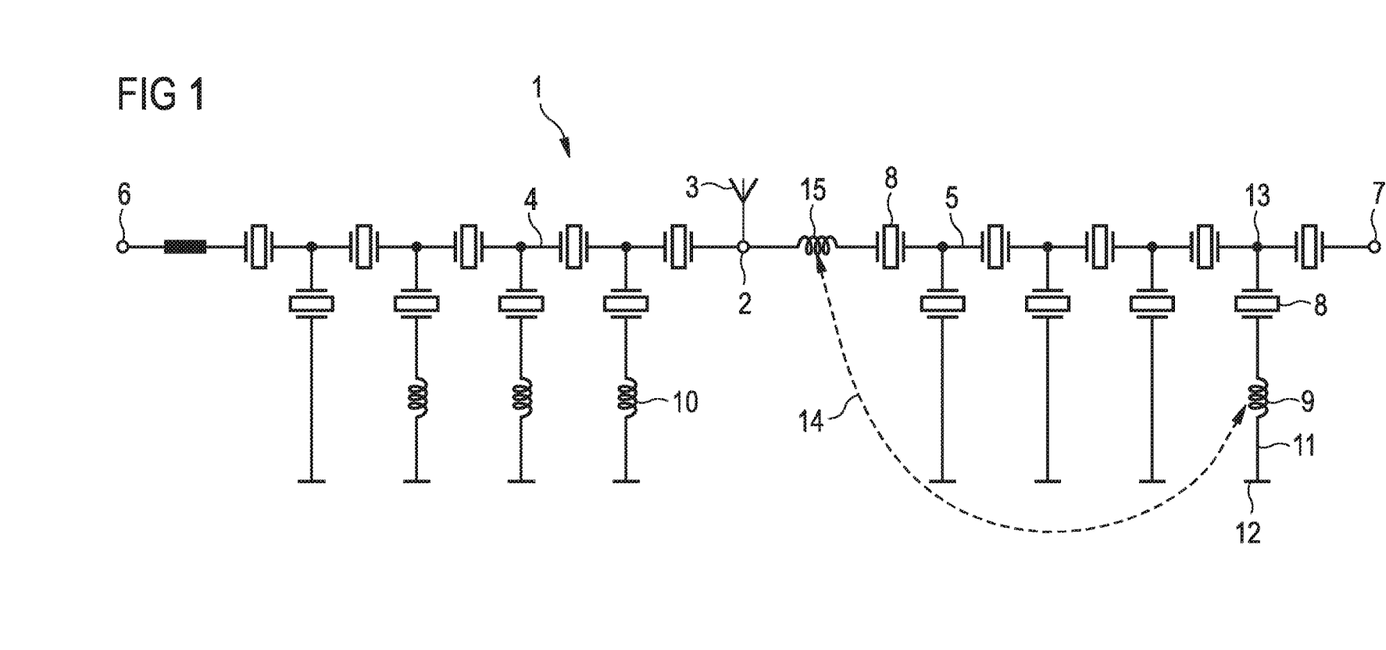
FIG. 1 shows an equivalent circuit diagram of a circuit arrangement.

FIG. 1 shows an equivalent circuit diagram of a circuit arrangement 1. The circuit arrangement 1 comprises an antenna connection 2, to which an antenna 3 is connected. Furthermore, the circuit arrangement 1 comprises a transmission signal path 4 and a reception signal path 5. The transmission signal path 4 connects the antenna connection 2 to a transmission connection 6. The reception signal path 5 connects the antenna connection 2 to a reception connection 7.

The circuit arrangement 1 furthermore comprises electroacoustic components 8. Electroacoustic components 8 are arranged both in the transmission signal path 4 and in the reception signal path 5. The electroacoustic components 8 determine the acoustic properties, for example, the pass characteristic of the transmission signal path 4 and of the reception signal path 5. The electroacoustic components 8 can comprise components which operate with surface acoustic waves and/or components which operate with bulk acoustic waves.

Furthermore, the circuit arrangement 1 comprises a first conductor loop 9. In the circuit arrangement shown in FIG. 1, the first conductor loop 9 is an adapting element which alters the acoustic properties of the circuit arrangement 1. Furthermore, the circuit arrangement 1 comprises further conductor loops 10.

The reception signal path 5, which connects the antenna connection 2 to the reception connection 7, is connected via secondary paths 11 in each case to a reference potential 12, wherein an electroacoustic component 8 and/or a conductor loop 9, 10 are/is interconnected in the secondary paths 11 in each case between a node 13 arranged in the reception signal path 5 and the reference potential 12. By way of example, the fourth secondary path 11 as viewed from the antenna connection 2 connects the node 13 of the reception signal path 5 to the reference potential 12 via an electroacoustic component 8 and the first conductor loop 9.

Furthermore, the transmission signal path 4 is also connected via secondary paths 11 in each case to the reference potential 12, wherein an electroacoustic component 8 and/or a conductor loop 10 are/is interconnected in the secondary paths 11 in each case between a node 13 arranged in the transmission signal path 4 and the reference potential 12.

The first conductor loop 9 is coupled to a further element 15 of the circuit arrangement 1 by an inductive coupling 14. In accordance with FIG. 1, the further element 15 is a second conductor loop interconnected in the reception signal path 5. The second conductor loop is interconnected in series between the antenna connection 2 and an electroacoustic component 8.

The inductive coupling 14 between the first conductor loop 9 and the further element 15 is a parasitic coupling which alters the acoustic properties of the circuit arrangement 1 in an undesirable manner. The influence of the inductive coupling 14 is particularly great since a large part of the reception signal path 5 is bridged by the inductive coupling 14 in the topology of the equivalent circuit diagram.

Furthermore, the first conductor loop 9 can also inductively couple to other elements of the circuit arrangement 1. However, firstly only the coupling between the first conductor loop 9 and a single further element 15 is considered below. An extension to a plurality of couplings is considered afterward.

Figure 2:
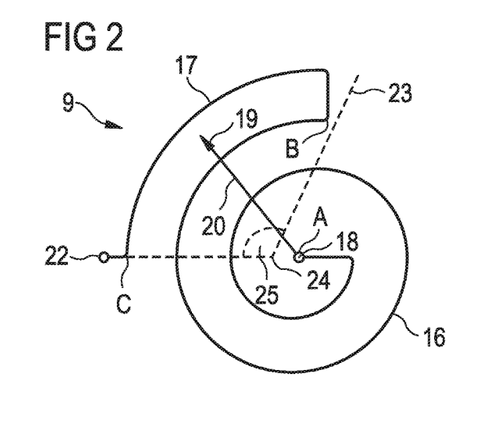
FIG. 2 shows a first conductor loop.

FIG. 2 shows one configuration of the first conductor loop 9, which makes it possible to compensate for the coupling 14 between the first conductor loop 9 and the further element 15.

The first conductor loop 9 shown in FIG. 2 comprises a main loop 16 and a negative feedback loop 17. The negative feedback loop 17 has a sense of curvature which is opposite to a sense of curvature of the main loop 16.

The midpoint of the first conductor loop 9 is defined as point A. If the conductor loop 9 is then run out proceeding from the point A, a first sense of curvature is always present between the point A and a point B. The sense of curvature changes at the point B. A second sense of curvature, which is opposite to the first sense of curvature, is always present between the point B and a point C.

Accordingly, the point B of the first conductor loop 9 is defined as the point of separation of the first conductor loop 9 into the main loop 16 and into the negative feedback loop 17. The point B of separation is defined by the fact that the sense of curvature of the first conductor loop 9 changes at this point B. If a straight conductor piece is arranged between a main loop 16 having a first sense of curvature and a negative feedback loop 17 having a second sense of curvature, then the midpoint of the straight conductor piece is defined as the point B of separation between main loop 16 and negative feedback loop 17.

In this case, that part of the first conductor loop 16 which has a greater inductance is always regarded as the main loop 16 of the first conductor loop 9. Accordingly, the main loop 16 has a greater inductance than the negative feedback loop 17.

Furthermore, a geometrical centroid 18 of the main loop 16 is defined. For this purpose, the convex envelope of the main loop 16 is considered and the geometrical centroid of the convex envelope is defined as the geometrical centroid 18 of the main loop 16. Analogously, the geometrical centroid of the convex envelope of the negative feedback loop 17 is defined as the geometrical centroid 19 of the negative feedback loop 17.

The connecting line between the geometrical centroid 19 of the negative feedback loop 17 and the geometrical centroid 18 of the main loop 16 is furthermore defined as the effective direction 20 of the negative feedback loop 17.

An explanation is given below of how the inductive coupling 14 between the first conductor loop 9 and the further element 15 is compensated for by the negative feedback loop 17. This involves firstly determining which of the elements of the circuit arrangement 1 is inductively coupled to the first conductor loop 9 particularly strongly and in a particularly disturbing manner. This will generally be conductor loops which, as considered in the topology of the equivalent circuit diagram, are situated far away from the first conductor loop 9 considered.

In particular, the sensitivity and the absolute strength of the coupling 14 are crucial to the relevance of a coupling 14.

The sensitivity of a coupling 14 is all the greater, the larger that part of the circuit arrangement 1 which is bridged by the coupling 14 in a topological consideration.

Figure 5:
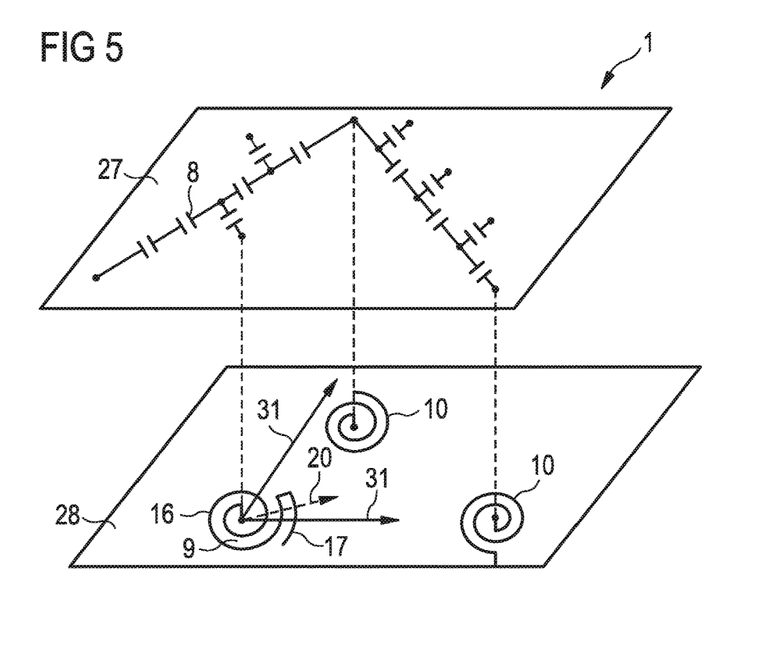
FIG. 5 shows a circuit arrangement which results from the interconnection of the chip shown in FIG. 4 with the substrate.

The direction 31 of the coupling 14, which is depicted in FIG. 5, for example, is defined by a connecting line which connects the geometrical centroid of the main loop 16 of the first conductor loop 9 and the geometrical centroid of the further element 15 to one another. The negative feedback loop 17 is then arranged in such a way that the effective direction 20 of the negative feedback loop 17 corresponds to the direction 31 of the coupling 14.

In this case, the negative feedback loop 17 also couples inductively to the further element 15. Since the negative feedback loop 17 has an opposite sense of curvature relative to the main loop 16, the coupling between the negative feedback loop 17 and the further element 15 influences the acoustic properties of the circuit arrangement 1 in an opposite way to the coupling 14 between the main loop 16 and the further element 15. Accordingly, the negative feedback loop 17 compensates for the inductive coupling 14 between the main loop 16 and the further element 15. In this way, the undesirable parasitic coupling 14 between the main loop 16 of the first conductor loop 9 and the further element 15 is virtually compensated for.

For the compensation of the coupling 14 between the main loop 16 and the further element 15, it is not necessary for the effective direction 20 of the negative feedback loop 17 to correspond exactly to the direction 31 of the coupling 14 between the main loop 16 and the further element 15. Rather, the effective direction 20 of the negative feedback loop 17 can deviate from the direction of the coupling by up to 50°. Even in the case of such a deviation of the effective direction 20 of the negative feedback loop 17 from the direction 31 of the coupling 14, the coupling 14 can be compensated for.

The negative feedback loop 17 has a length which corresponds to at least 70% of the length of a turn of the main loop 16.

The negative feedback loop 17 has an ellipse-segment-shaped turn. The end points 22, 23 of the ellipse segment form an angle 25 of at least 90°, preferably of at least 160°, with the midpoint 24 of the associated ellipse. In FIG. 2, the negative feedback loop 17 has a circle-segment-shaped turn, wherein the end points 22, 23 of the circle segment form an angle 25 of at least 90°, preferably of at least 160°, with the midpoint 24 of the associated circle.

Figure 3:
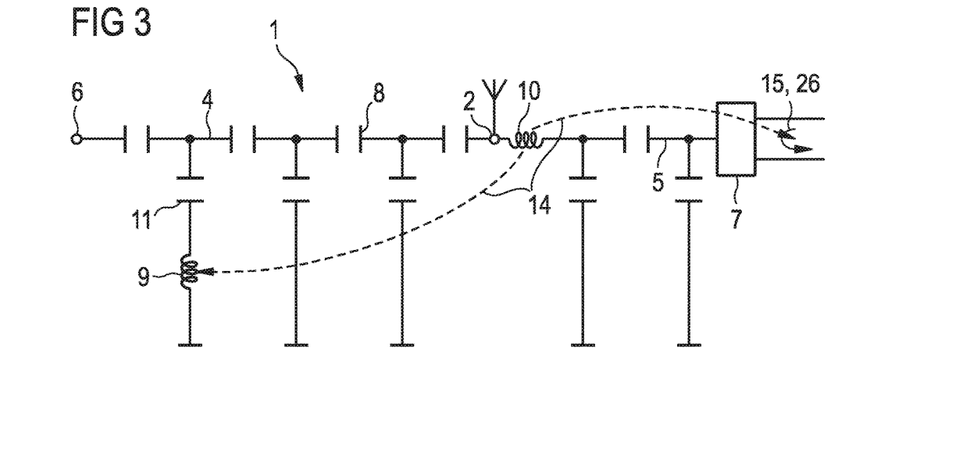
FIG. 3 shows a further equivalent circuit diagram of a circuit arrangement.

FIG. 3 shows a further equivalent circuit diagram of a circuit arrangement 1, in which a first conductor loop 9 is inductively coupled to a further element 15. The structure of the circuit arrangement 1 substantially corresponds to the structure of the circuit arrangement 1 shown in FIG. 1. The circuit arrangement 1 shown in FIG. 3 also connects an antenna connection 2 to a transmission connection 6 via a transmission signal path 4 and to a reception connection 7 via a reception signal path 5. Furthermore, the circuit arrangement 1 comprises secondary paths 11 which in each case connect the transmission signal path 4 or the reception signal path 5 to a reference potential 12 via electroacoustic components 8 and/or conductor loops 9, 10.

In the case of the circuit arrangement 1 shown in FIG. 3, the reception connection 7 of the reception signal path 5 is configured in a balanced fashion. Accordingly, the reception connection 7 comprises an output conductor loop 26. The output conductor loop 26 here is the further element 15, which inductively couples to the first conductor loop 9. The first conductor loop 9 is arranged in a secondary path 11 of the transmission signal path 4 and serves for adapting the acoustic properties of the transmission signal path 4. A particularly large part of the topology of the circuit arrangement 1 is bridged by such a coupling 14, such that the sensitivity of the coupling 14 to the frequency properties of the circuit arrangement 1 is particularly high.

The first conductor loop 9 furthermore comprises, as shown in FIG. 2, the main loop 16 and the negative feedback loop 17. The effective direction 20 of the negative feedback loop 17 is once again defined as described above. Accordingly, the negative feedback loop 17 can compensate for the coupling 14 of the first conductor loop 9 to the further element 15, here the output conductor loop 26 of the reception connection 7 configured in a balanced fashion.

The first conductor loop 9 can be an arbitrary conductor loop of the circuit arrangement 1. The first conductor loop 9 can be arranged in the transmission signal path 4, the reception signal path 5 or in one of the secondary paths 11. The further element 15 can likewise be an arbitrary element of the circuit arrangement 1. By way of example, the further element 15 can be arranged in the transmission signal path 4, the reception signal path 5 or in one of the secondary paths 11. As shown in FIG. 3, the further element 15 can also be formed by the reception connection 7.

Figure 4:
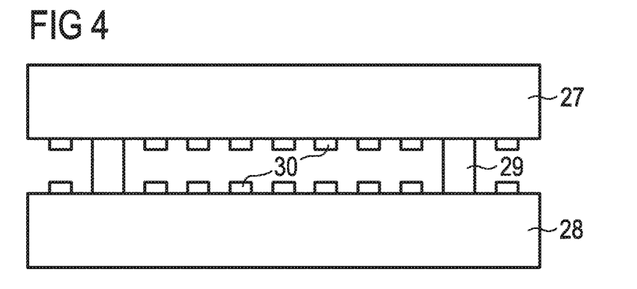
FIG. 4 shows a chip arranged on a substrate.

FIG. 4 shows a schematic view of a chip 27 bonded on a substrate 28. The chip 27 and the substrate 28 are interconnected with one another by means of bonding connections 29 to form a circuit arrangement 1. The chip 27 has component structures 30. In particular, the electroacoustic components 8 of the circuit arrangement 1 are arranged on the chip 27.

In accordance with the configuration in FIG. 4, component structures 30 are furthermore likewise arranged on the substrate 28. In particular, the first conductor loop 15 and further conductor loops 10 of the circuit arrangement 1 are arranged on the substrate 28. Consequently, the first conductor loop 15 and further conductor loops 10 lie directly opposite the electroacoustic components 8.

Alternatively, the first conductor loop 15 and further conductor loops 10 can also be formed by metallizations within the substrate 28.

FIG. 5 shows a circuit arrangement 1 which results from the interconnection of the chip 27 with the substrate 28. The electroacoustic components 8 arranged on the chip 27 are illustrated as an equivalent circuit diagram in the illustration in FIG. 5, wherein the arrangement of the electroacoustic components 8 in the illustration in FIG. 5 is modeled on the actual geometrical arrangement on the chip 27. Furthermore, FIG. 5 depicts the conductor loops 9, 10 on the substrate 28.

The compensation of couplings of the first conductor loop 9 to a plurality of further elements 15 is considered with reference to FIG. 5.

The circuit arrangement 1 comprises a first conductor loop 9, a second conductor loop 10 and a third conductor loop 10. The first conductor loop 9 comprises a main loop 16 and a negative feedback loop 17. Furthermore, the effective direction 20 of the negative feedback loop is depicted in a dashed manner. The negative feedback loop 17 here is configured to compensate for a coupling 14 both to the second conductor loop 10 and to the third conductor loop 10. The effective direction 20 of the negative feedback loop 17 and the directions 31 of the respective coupling here in each case form an angle which is less than 50°.

Figure 6:
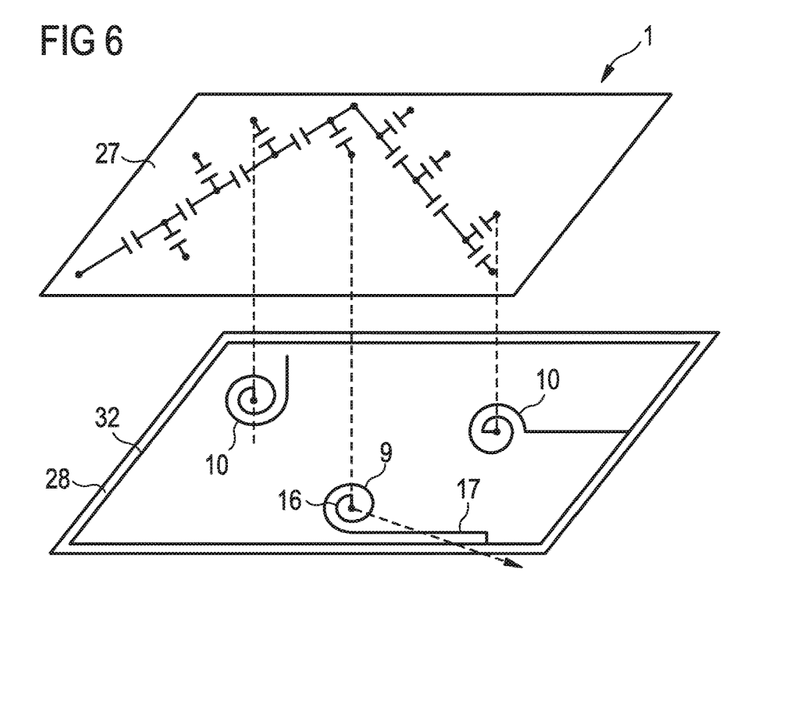
FIG. 6 shows a further configuration of the circuit arrangement.

FIG. 6 shows a further configuration of the circuit arrangement 1. The manner of illustration in FIG. 6 in this case corresponds to the illustration in FIG. 5. In accordance with the configuration shown in FIG. 6, the negative feedback loop 17 is connected to a frame 32 arranged on the substrate 28. Accordingly, the frame 32 contributes to the negative feedback. The frame 32 comprises a metal, for example, copper.

Figure 7:
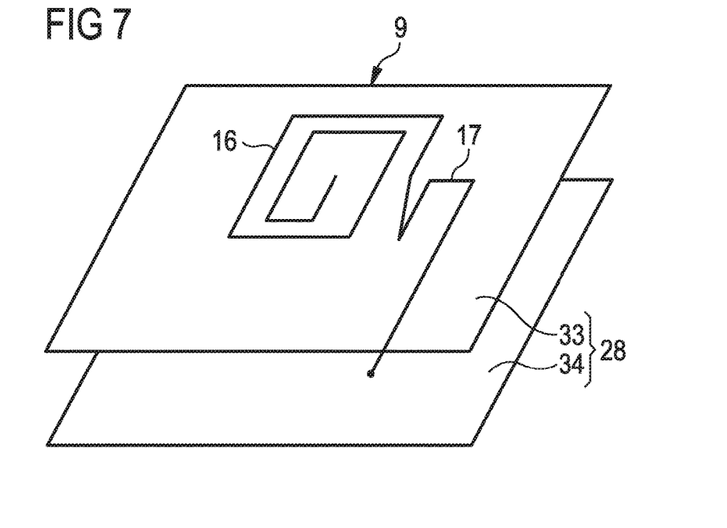
FIG. 7 shows a first conductor loop in a multilayered substrate.

FIG. 7 shows an exemplary embodiment of the first conductor loop 9 in a multilayered substrate 28 comprising a first layer 33 and a second layer 34. The first conductor loop 9 is arranged partly on a first layer 33 of the substrate 28 and partly on a second layer 34 of the substrate 28. In FIG. 7, the main loop 16 is arranged in the first layer 33 of the substrate 28. Furthermore, the negative feedback loop 17 is arranged in the second layer 34 of the substrate 28.

Figure 8:
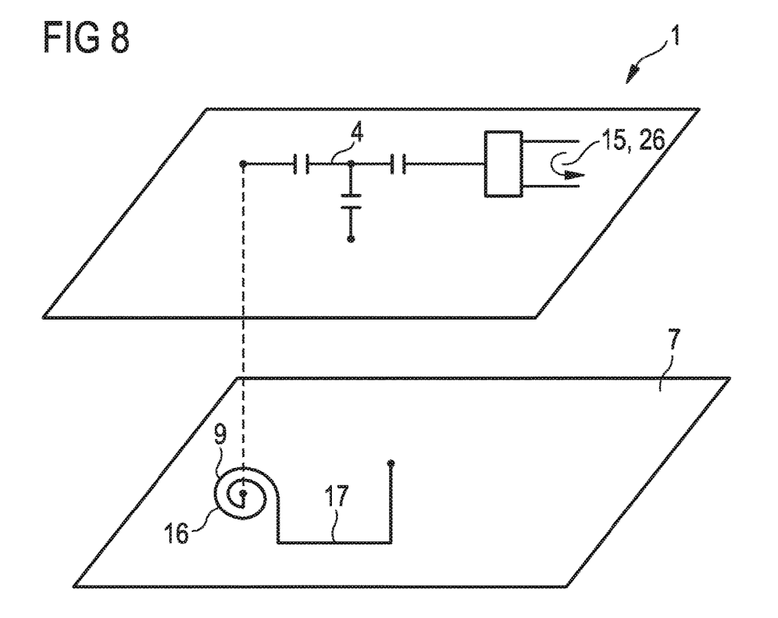
FIG. 8 shows a further configuration of the circuit arrangement.

FIG. 8 shows a circuit arrangement 1 in the same illustration as in FIGS. 5 and 6. The first conductor loop 9 here is interconnected with the transmission signal path 4 of the circuit arrangement 1. The further element 15, as also in FIG. 3, is an output conductor loop 26 formed by the reception connection 7 of a DMS track, said reception connection being configured in a balanced fashion. The negative feedback loop 17 once again compensates for a coupling between the main loop 16 and the further element 15.

Figure 9:
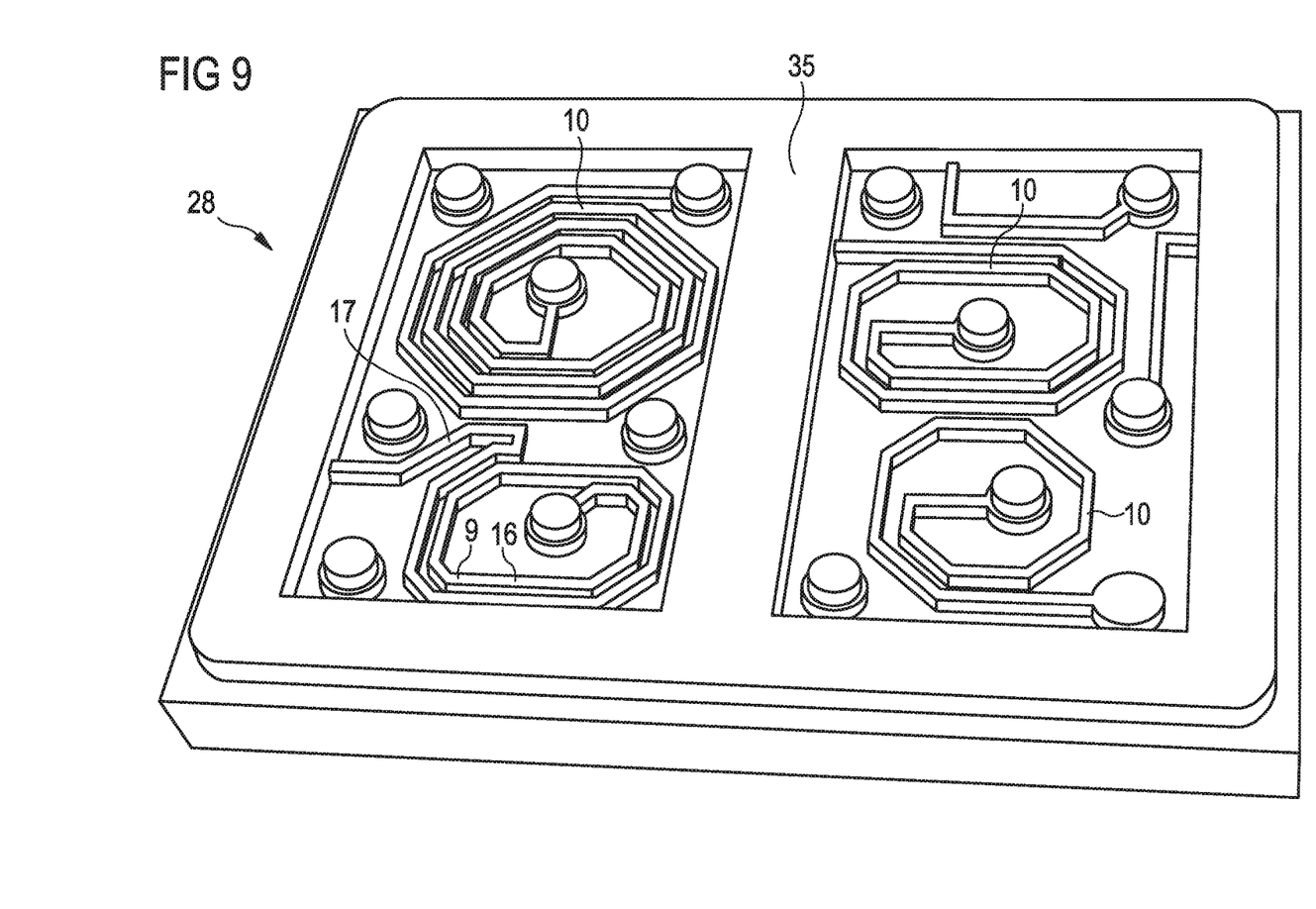
FIG. 9 shows a substrate with conductor loops arranged on the substrate in perspective view.

FIG. 9 shows the substrate 28 of the circuit arrangement in perspective view. A chip 27, not shown in FIG. 9, is furthermore bonded on said substrate 28. A metallization 35 is arranged on the substrate 28. The metallization forms the conductor loops 9, 10. The metallization 35 on the substrate 28 here comprises the first conductor loop 9 and three further conductor loops 10. The first conductor loop 9 comprises the main loop 16 and the negative feedback loop 17. The negative feedback loop 17 can, as described above, compensate for a coupling of the main loop 16 to one or to a plurality of further elements 15. In this case, the couplings 14 are superposed to form a total coupling, which is in turn compensated for by the negative feedback loop 17.

Furthermore, the compensation of the coupling between the main loop 16 and the further elements 15 can be improved further by a variation of the size and the position of the negative feedback loop 17.

In addition to the configuration of the first conductor loop 9 comprising the main loop 16 and the negative feedback loop 17, further measures can be undertaken for reducing an inductive coupling 14. By way of example, the distances between the coupling elements can be increased. Ground areas or via fences can be used for shielding between elements which couple to one another inductively. Furthermore, it is possible to use a topology in which couplings between conductor loops are not as relevant, for example, by using coils which are arranged close to one another, as considered from the topology of the filter equivalent circuit diagram. Inductive coupling can be compensated for by capacitive coupling. Furthermore, additional electromagnetic poles could be used for compensating for the inductive coupling. The design of an acoustic system could be chosen in such a way that it constitutes an optimum solution under the boundary condition of the existing couplings. Furthermore, balances, for example, in the case of balanced connections, can be used to minimize inductive coupling.

The invention claimed is:

1. A circuit comprising:
   a first conductor loop comprising a main loop and an opposite curvature loop, wherein the first conductor loop comprises a continuous trace forming the main loop and the opposite curvature loop; and
   a further element, wherein:
   the opposite curvature loop has a sense of curvature that is opposite to a sense of curvature of the main loop;

the opposite curvature loop reduces a coupling between the main loop and the further element; and the circuit comprises an electroacoustic component, wherein the first conductor loop adapts acoustic properties of the circuit.

2. The circuit according to claim 1, wherein a connecting line between a geometrical centroid of the opposite curvature loop and a geometrical centroid of the main loop defines an effective direction of the opposite curvature loop, which deviates by a maximum of 50° from a direction of the coupling between the main loop and the further element, wherein the direction of the coupling is defined by the connecting line of the geometrical centroids of the main loop and of the further element.

3. The circuit according to claim 1, wherein the opposite curvature loop has a length that corresponds to at least 70% of a turn of the main loop.

4. The circuit according to claim 1, wherein the opposite curvature loop has an ellipse-segment-shaped turn, wherein end points of the ellipse segment form an angle of at least 90° with a midpoint of the associated ellipse.

5. The circuit according to claim 1, wherein the opposite curvature loop has a lower inductance than the main loop.

6. The circuit according to claim 1, wherein the circuit comprises a chip arranged on a substrate, and wherein the first conductor loop is arranged on a side of the substrate that faces the chip.

7. The circuit according to claim 1, further comprising a substrate, wherein the first conductor loop is arranged in the substrate.

8. The circuit according to claim 1, wherein the further element comprises a further conductor loop.

9. The circuit according to claim 1, wherein the circuit comprises a plurality of further elements each of the further elements being coupled to the main loop of the first conductor loop, wherein the couplings are superposed to form a total coupling, and wherein the opposite curvature loop reduces the total coupling.

10. The circuit according to claim 9, wherein a direction of the opposite curvature loop deviates by a maximum of 50° from each of the directions of the couplings between the main loop and the further elements.

11. The circuit according to claim 1, wherein the first conductor loop has only two terminals, wherein the main loop and the opposite curvature loop are coupled between the two terminals.

* * * * *